(12) United States Patent
She et al.

(10) Patent No.: US 10,499,533 B1
(45) Date of Patent: Dec. 3, 2019

(54) CONTAINER CABLING SYSTEMS AND METHODS

(71) Applicant: Fujitsu Limited, Kanagawa (JP)

(72) Inventors: Qingya She, Allen, TX (US); Kirsten Rundberget, Wylie, TX (US); Weisheng Xie, Plano, TX (US)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 16/052,075

(22) Filed: Aug. 1, 2018

(51) Int. Cl.
| | |
|---|---|
| H05K 7/14 | (2006.01) |
| B65D 88/02 | (2006.01) |
| H02G 3/04 | (2006.01) |
| H02G 3/38 | (2006.01) |
| B65D 88/12 | (2006.01) |

(52) U.S. Cl.
CPC ......... *H05K 7/1497* (2013.01); *B65D 88/022* (2013.01); *B65D 88/121* (2013.01); *H02G 3/04* (2013.01); *H02G 3/0462* (2013.01); *H02G 3/381* (2013.01); *H02G 3/383* (2013.01); *H02G 3/386* (2013.01)

(58) Field of Classification Search
CPC .... H05K 7/1497; B65D 88/022; B65D 88/10; B65D 88/121; E04H 1/04; E04H 2001/1283; E04H 2005/005
See application file for complete search history.

(56) References Cited

U.S. PATENT DOCUMENTS

| | | | | |
|---|---|---|---|---|
| 5,675,194 A | * | 10/1997 | Domigan | H01R 25/168 174/50 |
| 5,747,734 A | * | 5/1998 | Kozlowski | H02B 1/305 174/37 |
| 5,957,557 A | * | 9/1999 | Langer | A47B 77/08 312/223.6 |
| 6,109,469 A | * | 8/2000 | Clive-Smith | B65D 88/022 220/1.5 |
| 7,278,273 B1 | | 10/2007 | Whitted et al. | |
| 7,296,704 B2 | * | 11/2007 | Ferrini | B65D 88/522 220/1.5 |
| 7,784,224 B2 | * | 8/2010 | Peckham | E04H 1/04 52/106 |
| 8,517,006 B2 | * | 8/2013 | Frock | F24C 15/327 126/20 |
| 8,755,184 B2 | | 6/2014 | Peng et al. | |

(Continued)

FOREIGN PATENT DOCUMENTS

WO    2006/011869    2/2006

*Primary Examiner* — Robert J Hoffberg
(74) *Attorney, Agent, or Firm* — Baker Botts L.L.P.

(57) ABSTRACT

An exemplary cabling system includes a plurality of containers. A first container of the plurality of containers defines a first plurality of openings. The system includes a plurality of bolts with a first bolt operable to insert into the first plurality of openings. The first bolt defines a first conduit operable to receive a first cable of a plurality of cables. An exemplary telecommunications central office includes a container with a plurality of walls defining an interior of the container and an exterior of the container, an opening, a vault entrance, and a plurality of cable runways. An exemplary method for arranging cables includes cutting a wall of a first and second container to create a first and second opening, inserting flanges of bolts into the openings, receiving with a pipe the flanges, and routing a cable through the first and second opening into an interior of the second container.

15 Claims, 11 Drawing Sheets

(56) References Cited

U.S. PATENT DOCUMENTS

| | | | |
|---|---|---|---|
| 9,572,288 B2* | 2/2017 | Wilcox | H05K 7/1492 |
| 9,750,156 B2* | 8/2017 | Hopperton | H02G 3/06 |
| 9,850,655 B2* | 12/2017 | Matori | H05K 7/20745 |
| 9,929,554 B2* | 3/2018 | Ross | H02G 5/08 |
| 10,172,261 B2* | 1/2019 | Wilcox | H05K 7/1492 |
| 2013/0032638 A1 | 2/2013 | Therrien et al. | |
| 2018/0109112 A1* | 4/2018 | Paine | B65D 88/022 |
| 2018/0109162 A1* | 4/2018 | Paine | B65D 88/022 |
| 2018/0109163 A1* | 4/2018 | Paine | B65D 88/022 |

\* cited by examiner

CONTAINER CABLING SYSTEMS AND METHODS

FIELD OF THE DISCLOSURE

The present disclosure relates to cabling systems and methods for telecommunication central offices, server offices, and other data centers or offices with numerous cables.

BACKGROUND

Existing cabling systems for applications such as telecommunication central offices may have high real estate expenses, long building periods, and a fixed amount of available space. Because systems have a fixed amount of space, it can be difficult to add new equipment and route numerous cables. Many cabling systems have tens of thousands of cables or more.

SUMMARY

Disclosed herein are modular cabling systems and telecommunications central offices that overcome the disadvantages of prior systems and offices, provide the ability to expand as needed, and provide for low upfront expenses. An exemplary modular cabling system includes a plurality of containers with a first container. The system may be expanded by adding or connecting multiple containers and then routing cables through openings of the containers. The first container defines a first plurality of openings. The system includes a plurality of bolts with a first bolt. The first bolt of the plurality of bolts includes an outer ring and a flange. The flange is operable to insert into each of the first plurality of openings. To route cables, the first bolt defines a first conduit operable to receive at least a first cable of a plurality of cables.

An exemplary modular cabling system includes a plurality of pipes with a first pipe. The pipes serve as a connection from one opening to another. The first pipe comprises a first side and a second side and defines a chamber. A flange of a bolt is inserted into a first opening of a first plurality of openings. The first pipe receives the flange with the chamber at the first side through the first opening. The first pipe, when receiving the flange, is operable to receive at least one of the plurality of cables through the first conduit into the chamber.

An exemplary system includes a bolt with a flange that includes threads. A pipe is complementarily threaded in the chamber to receive the threads.

An exemplary system includes a first container defining a first plurality of openings and a second container defining a second plurality of openings. Such a system may allow for expansion in any direction through connection of any opening of the first container with any opening of the second container. To route cables, the system creates a closed path from the first container to the second container as follows. The system includes a pipe comprising a first side and a second side. The pipe defines a chamber. A flange of a first bolt of a plurality of bolts is inserted into a first opening of the plurality of openings. A flange of a second bolt of the plurality of bolts is inserted into a second opening of the second plurality of openings. The flange of the second bolt defines a second conduit. The pipe receives the first flange with the chamber at the first side. The pipe receives the second flange with the chamber at the second side. The pipe, the first bolt, and the second bolt are thereby operable to route the at least a first cable of the plurality of cables from the first container through the opening of the plurality of openings, through the first conduit, through the chamber, through the second conduit, through the opening of the second plurality of openings, and into the second container.

An exemplary system includes containers with corrugated walls. When creating closed paths, tightened bolts may exert pressure against container walls. To seal walls and to prevent bolts from damaging the containers, the system may use washers. An exemplary system includes a washer with a corrugated side and a second washer side, wherein the corrugated side is operable to complement the corrugated wall. The second washer side is operable to contact the outer ring thereby distributing pressure exerted by the bolt across the washer.

Users of the system may wish to seal existing openings defined by containers, to prevent equipment in the container from being damaged. An exemplary system includes a flange inserted into a first opening of a plurality of openings defined by a container. A cap contacts the exterior of the first container, receiving the flange, thereby sealing the first opening.

To allow for the system to be expanded in any direction, an exemplary system includes a plurality of openings defined by the container. The system includes a container with six walls. The container defines a plurality of openings including at least six openings. Each of the six walls defines at least one opening of the plurality of openings.

To route cables within the container, or to or from openings of the container, the container may include cable runways. An exemplary system includes a y cable runway extending through the interior of the container in a y direction, an x cable runway extending through the interior of the container in an x direction, and a z cable runway extending through the interior of the container in a z direction.

An exemplary modular cabling system includes a system of interconnected cable runways, including a plurality of cable runways extending in the x direction, and a plurality of cable runways extending in the z direction. At least a first cable runway of the plurality of cable runways extending in the x direction is inside the first container. At least a second cable runway of the plurality of cable runways extending in the x direction is inside the second container. At least a first cable runway of the plurality of cable runways extending in the z direction is inside the first container. At least a second cable runway of the plurality of cable runways extending in the z direction is inside a second container.

Users may need to access a cable utility vault to route cables or perform maintenance. An exemplary system includes a container with a vault entrance.

Disclosed herein are telecommunications central offices. A telecommunications central office may be self-contained or may allow for expansion as needed. An exemplary telecommunications central office includes a container with a plurality of walls. The plurality of walls includes a first x-z wall and a second x-z wall, a first x-y wall and a second x-y wall, and a first y-z wall and a second y-z wall. The plurality of walls defines an interior of the container and an exterior of the container. The first x-z wall defines an opening. The first x-z wall defines a vault entrance. The container includes a plurality of runways. The plurality of runways includes a y cable runway extending through the container in a y direction, an x cable runway extending through the container in an x direction, and a z cable runway extending through the container in a z direction. The plurality of runways is operable to receive a plurality of cables from the opening.

To receive cables from outside a container, an exemplary telecommunications central office includes a bolt comprising an outer ring and a flange. The outer ring contacts a first x-z wall of a container of the telecommunications central office. The flange is inserted into an opening defined by a first x-z wall of the container. The bolt defines a cable conduit operable to receive a plurality of cables from an exterior of the container through the opening into an interior of the container.

An exemplary telecommunications central office includes a container with a first x-z wall that defines a first opening, a second x-z wall that defines a second opening, a first x-y wall that defines a third opening, a second x-y wall that defines a fourth opening, a first y-z wall that defines a fifth opening, and a second y-z wall that defines a sixth opening. Openings allow parts such as bolts and pipes to expand the system and route cables in any direction.

A user may wish to seal existing holes on a telecommunications central office container, to protect equipment from outside elements. An exemplary telecommunications central office includes a container with a plurality of walls that includes a first x-z wall that defines a first opening. One of the plurality of walls defines a second opening. The telecommunications office includes a bolt with an outer ring and a flange. The outer ring contacts the wall defining the second opening. The flange extends into the second opening. The bolt defines a cable conduit. The bolt receives a cap through the second opening thereby sealing the second opening.

The telecommunications central office may include cable runways for routing cables. An exemplary telecommunications central office includes a z cable runway extending through a container in a z direction. The z cable runway is operable to receive from an x cable runway a cable of a plurality of cables and route the cable of the plurality of cables to a distribution frame.

Many offices include numerous cables. Disclosed herein are methods for arranging a plurality of cables such that the office can expand as needed. An exemplary method includes cutting a wall of a first container to create a first opening and cutting a wall of a second container to create a second opening. The method includes inserting a flange of a first bolt into the first opening and inserting a flange of a second bolt into the second opening. The method includes receiving with a pipe the flange of the first bolt at a first side of the pipe and receiving with the pipe the flange of the second bolt at a second side of the pipe. The method includes routing a first cable of a plurality of cables through the first opening, a conduit of the first bolt, a chamber of the pipe, the second opening, a conduit of the second bolt, and into an interior of the second container.

A user may wish to expand the system vertically and route a cable from a first container to a second container stacked on the first container. An exemplary method includes cutting a top wall of a first container and cutting a bottom wall of the second container. The method further includes stacking the second container onto the first container.

An exemplary method includes routing cables to runways to route the cables to desired locations. The method includes routing a first cable of a plurality of cables to a cable runway in a first container and routing the first cable of the plurality of cables to a cable runway in a second container.

An exemplary method includes using washers to prevent bolts from damaging containers. The method includes placing a first corrugated washer around a first opening of a container and placing a second corrugated washer around a second opening of the container. When bolts are tightened against the washers to create a closed path, for example, the washers distribute pressure across the container wall thereby preventing damage to the container.

A user may wish to create a closed path from one container to another container to route cables between containers. An exemplary method includes aligning a wall of a first container with a wall of a second container and aligning a first opening of the first container with a second opening of the second container.

BRIEF DESCRIPTION OF THE DRAWINGS

For a more complete understanding of the present disclosure and its features and advantages, reference is now made to the following description, taken in conjunction with the accompanying drawings, which depict various embodiments of the disclosure.

DETAILED DESCRIPTION

In the following description, details are set forth by way of example to facilitate discussion of the disclosed subject matter. It should be apparent to a person of ordinary skill in the field, however, that the disclosed embodiments are exemplary and not exhaustive of all possible embodiments.

As will be described in further detail, the inventors of the present disclosure have developed cabling systems, telecommunications central offices, and methods with modular functionality. The systems, offices, and methods disclosed herein may allow for more cost-effective, time-effective, and space-effective data and telecommunication operation for numerous applications.

Some figures, descriptions, and claims in this disclosure include an x-y-z orientation for point-of-reference purposes. The designations of the x, y, and z axes are arbitrary and may be rearranged. A plurality of elements refers to any two (or more) of the elements. The plurality may be the entire group of the identified elements or a portion thereof. Some figures, descriptions, and claims in this disclosure refer to first, second, and third elements, and so on. Unless clearly indicated otherwise, the designation of first, second, and third, and so on is arbitrary and is included only for point-of-reference purposes to enable discussion.

Systems disclosed herein solve problems of existing offices with numerous cables. "Office" as used in this disclosure may refer to any system using numerous cables, such as a server room. Another example of an office is a telecommunications central office, which may be run by a telecommunications service provider. A telecommunications central office may be a location where subscriber lines are connected. As an office needs to expand, for example, to provide data connections to additional subscribers, the office provider (or user) may be limited by the space of the office itself. The user may not have space to add additional equipment to add additional subscribers or provide additional services. A user that wishes to start office operation at a new location and expects eventual expansion may not want to start business at a large office with unused space. Such unused space may allow for expansion but causes high real estate expenses. Desired is a system that can begin small, limiting up-front expenses, and expand as needed to provide for a growing business or operation. Expansion often adds numerous cables that need to be routed to desired locations. Desired is a system that enables easy routing of cables, limits costs and labor, and allows for expansion.

Figure 1:
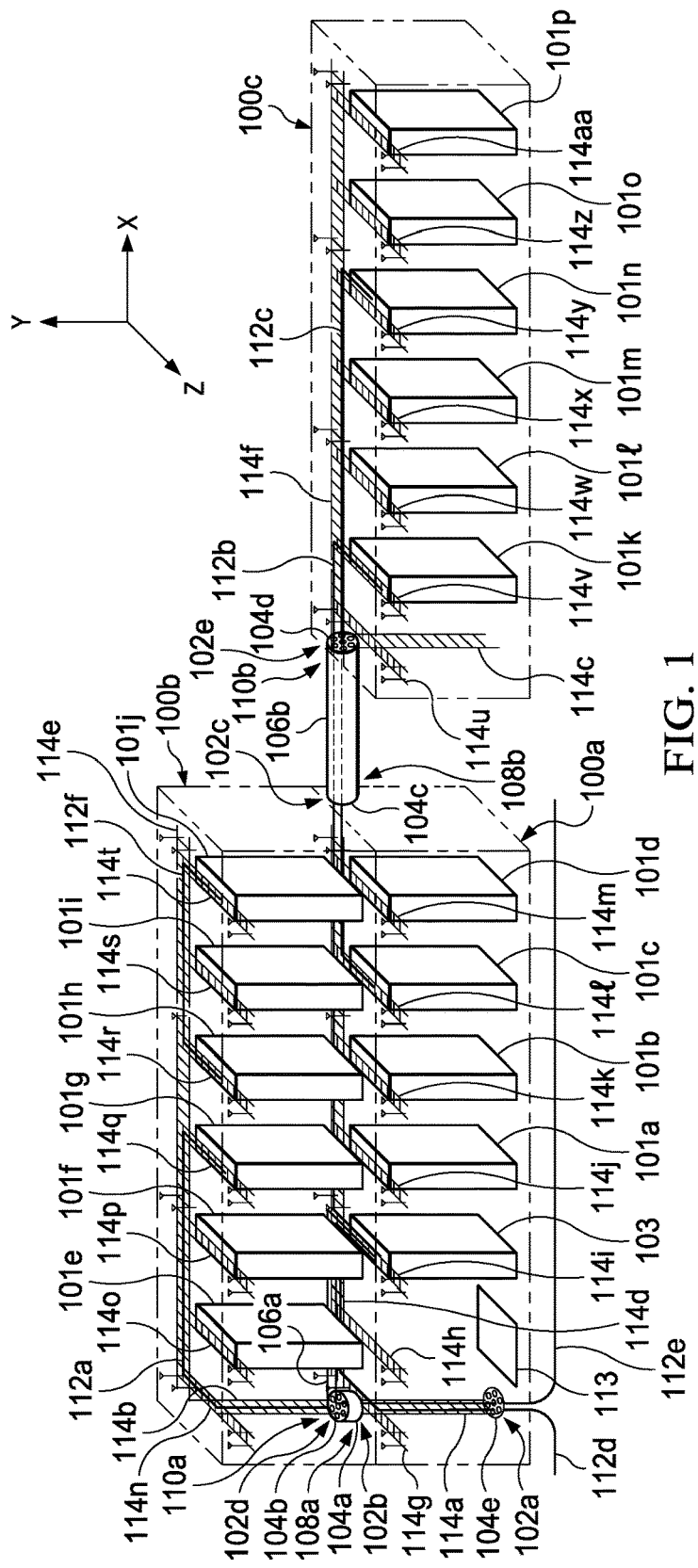
FIG. 1 is a schematic diagram of a modular cabling system.

FIG. 1 depicts an example of a modular cabling system that allows for low up-front space (and cost) and efficient expansion and routing of cables. The modular cabling system includes three containers 100a, 100b, and 100c. The containers 100a, 100b, and 100c have in their interior a plurality of equipment 101a through 101p. Equipment 101a through 101p may include any kind switching components, multiplexors, tributary cards, servers, power modules, communication equipment, or other electronic equipment, including any telecommunications central office equipment such as a main distribution frame or intermediate distribution frame. The container 100a contains a distribution frame 103 for routing signals. Examples of distribution frames include main distribution frames, intermediate distribution frames, optical distribution frames, and digital distribution frames.

In FIG. 1, a first container 100a is shown under a second container 100b. The second container 100b is stacked on the first container 100a. Stacking allows the modular cabling system to expand in the y direction. A third container 100c is shown expanding the system in the x direction. The system may have numerous additional containers which may expand the system in the x direction, the y direction, z direction, any two directions, or any three directions for any number of additional containers. The system as shown may have begun with a fully operation single container, such as the first container 100a to allow for low up-front costs. The second container 100b and third container 100c may be added later to expand the system to provide for a growing operation.

For structure, each container 100a through 100c has a plurality of walls. Each container 100a through 100c is shown with six walls. The walls oriented in the x-y plane, y-z plane, and x-z plane may be referred to as the x-y walls, y-z walls, and x-z walls, respectively. The top wall of each container 100a through 100c, shown in the x-z plane, may be referred to as a ceiling of the respective container. The bottom walls of each container 100a through 100c, shown in the x-z plane, may be referred to as the floor of the respective container. The plurality of walls of each container 100a through 100c define an interior and an exterior of the respective container. The walls may be corrugated on one or both sides, to add structural reinforcement.

When the system includes containers, the user may need to route cables into or out of each container. For example, the user may need to connect equipment inside one container to equipment inside another container. The cables may need to connect to equipment between containers or the cables may need to be routed into a container from a cable vault. To allow for cables to be routed, the modular cabling system may define one or more openings in one or more containers. The exemplary modular cabling system in FIG. 1 defines five openings, 102a through 102e. The first container 100a defines a plurality of openings 102a through 102c. "Define" is to be read as inclusive, not exclusive—meaning that a container that "defines" an opening defines at least one opening. The floor of the first container 100a defines a first opening 102a. The ceiling of the first container 100a defines a second opening 102b. A y-z wall of the first container 100a defines a third opening 102c. The floor of the second container 100b defines an opening 102d. A y-z wall of the third container 100c defines an opening 102e. Any container may define any number of openings. For example, the first container 100a may define a first plurality of openings, the second container 100b may define a second plurality of openings, and the third container 100c may define a third plurality of openings. Each wall on each container may define at least one opening. The modular cabling system may include containers where each has a set number of openings. For example, each container may have two openings on each of its six walls.

To further guide the cables between containers or between a container and a cable vault, the modular cabling system may include a plurality of bolts, each defining conduits to receive cables. The cables may be routed from opening to opening through a pipe that receives a bolt at each side, each bolt inserted in an opening. As described later, a bolt may be used to route cables from one container to another container in a path that is secure from outside elements. If a container defines an opening that is unused, a bolt may additionally be used to seal an opening when the bolt is inserted into the opening and receives the cap. The modular cabling system in FIG. 1 includes a plurality of bolts 104a through 104e. The modular cabling system may contain numerous additional bolts. Each bolt 104a through 104e is inserted into the openings 102a through 102e, respectively. Each bolt 104a through 104e may be received by a pipe and may be received by pipes.

A pipe may be used to route cables between containers or between a container and a cable vault. The cables can be routed through an opening of a first container, through a pipe, and through an opening of the second container. The system in FIG. 1 includes a plurality of pipes 106a and 106b. As shown in FIG. 1, the pipe 106a allows a user to route cable 112a between containers 100a and 100b. The pipe 106a extends in the y direction receives at a first side 108a the bolt 104a inserted in the opening 102b of the ceiling of the container 100a. At a second side 110a, the pipe 106a receives the bolt 104b inserted in the opening 102d of the floor of the container 100b. The pipe 106a thereby routes the cable 112a from the container 100a into the second container 100b and from the second container 100b into the first container 100a.

The system in FIG. 1 achieves routing the cables 112b and 112c between the containers 100a and 100c with a pipe 106b extending in the x direction. The pipe 106b receives at a first side 108b the bolt 104c inserted in the opening 102c of the y-z wall of the first container 100a. At a second side 110b, the pipe 106b is receiving the bolt 104d inserted in the opening 102e of the y-z wall of the third container 100c. The pipe 106b extending in the x direction is thereby operable to route a plurality of cables 112b and 112c from the container 100a into the container 100c or from the third container 100c into the first container 100a. Cable 112b connects the equipment 101k to the distribution frame 103. Cable 112c connects the equipment 101c to equipment 101n.

Rain, wind, or heat can damage cables or the systems in which they are used. By receiving a bolt on each side, the pipes 106a and 106b created closed paths for cables. The paths therefore allow a cable to be routed from one container to the next without being vulnerable to the elements.

Some users may need to route cables to and from a cable vault to send and receive signals to and from a subscriber. The system in FIG. 1 provides such access. The bolt 104e receives through conduits a plurality of cables 112d and 112e through the opening 102a defined by the floor of the first container 100a. The cables 112d and 112e are routed to and from the cable vault below the container 100a. The cables 112d and 112e are routed to the distribution frame 103. Additionally, a technician, engineer, or other personnel may need to access the cable vault to configure connection or perform maintenance. Accordingly, the container 100a provides a cable vault entrance 113 to allow a person to enter and exit the cable vault from the container 100a.

Once cables are routed between containers, the cables may need to be routed to specific locations within any given container. For example, a cable may need to be routed to a particular piece of equipment. A system of interconnected runways allows a provider to route cables between equipment and a cable vault. Shown in FIG. 1 is an example of a system of interconnected cable runways. Each container is shown with cable runways in the interior of the container. Some cable runways may be positioned to receive cables from another container or a cable vault, such as 114a, 114b, 114c, 114f, 114g, 114n, and 114u which are each positioned near an opening. As shown in FIG. 1, cable runways 114a through 114c extend in the y direction, cable runways 114d through 114f extend in the x-direction, and cable runways 114g through 114aa extend in the z direction. The cable runways 114a through 114aa are operable to receive cables from an opening, from other cable runways, from equipment, or any combination thereof. By using the cable runways 114a through 114aa to receive cables 112a through 112f, the system can route cables 112a through 112f to and from openings 102a through 102e, to and from other cable runways 114a through 114aa, to and from equipment 101a through 101q, or to any element from any element. The interconnected cable runway system is configured to have runways extending in the x, y, and z directions, parallel to the walls of the containers, so that cables routed to and from equipment are easily traceable. Easily traceable cables allow for more efficient replacing, removing, or rerouting cables.

Although the system in FIG. 1 includes three containers, the system may include less containers. The system may include any number of containers, expanding the system as needed in any x, y, or z direction, or a combination thereof. The additional containers may be added with openings, pipes, and bolts, thereby creating closed paths operable to route wires from one container to another. Although not shown in FIG. 1, a container may also be connected to another container on an x-y wall. Different walls of containers may be connected to each other. For example, a short side of a container can be connected to a long side of another container to route cables, and so on.

The system provides numerous advantages over prior systems in that it is scalable. It can be adapted for use with only one container or up to a system with any number of containers containing any amount of equipment. The system, by using an x-y-z orientation for cable runways, and by using openings, bolts, and pipes to route cables from one container to the next, allows for cables to be routed between equipment in the modular system in an expandable and organized manner, while being protected from damage.

Figure 2:
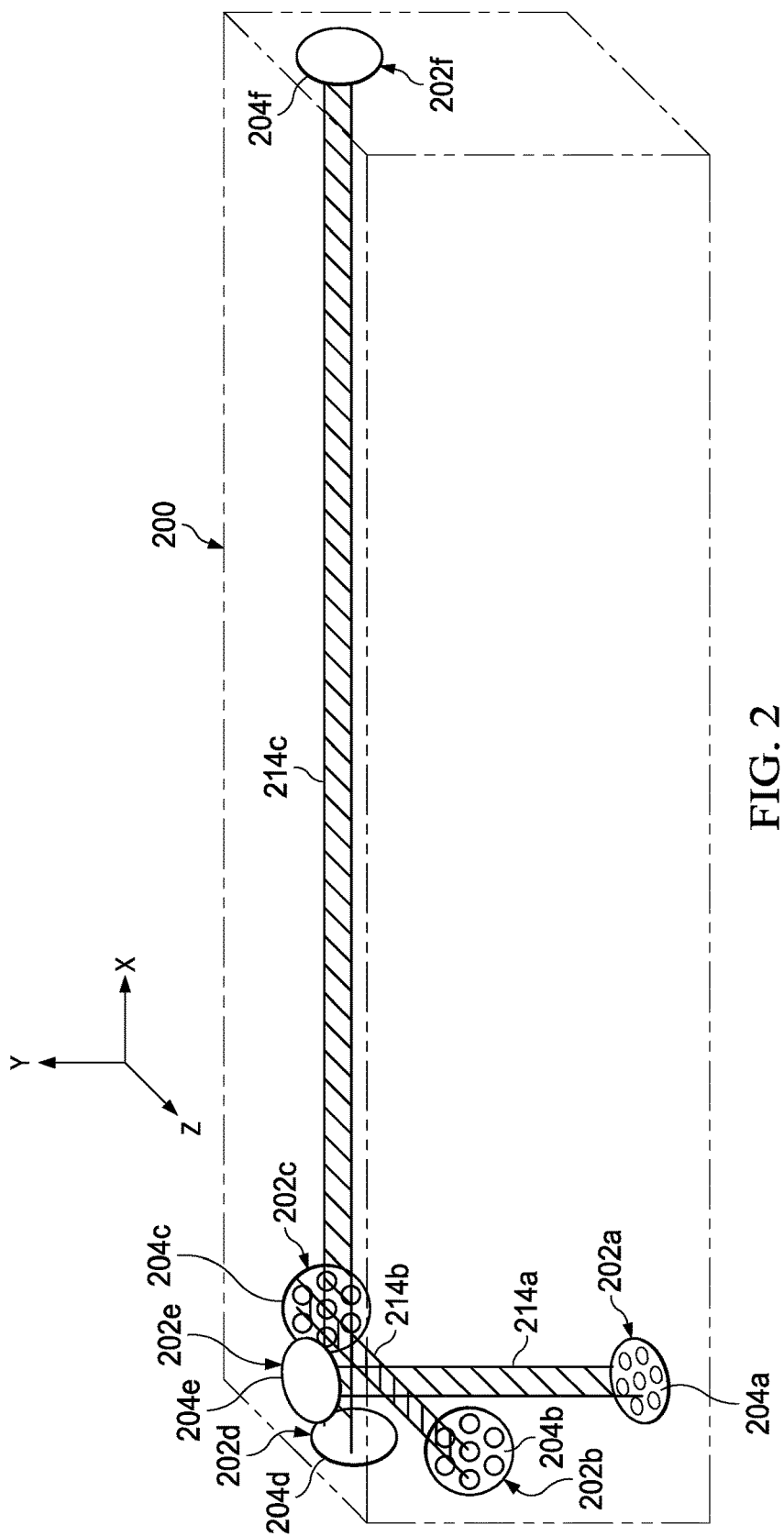
FIG. 2 is a schematic diagram of a modular cabling system, showing a container defining a plurality of openings.

Some cable runways may be positioned to receive cables from another container or a cable vault, thereby allowing the system to route a cable from one container to a cable runway in another container. Such positioning reduces or eliminates stray cables and therefore allows for a more organized, traceable, and efficient system. FIG. 2 depicts an example of a modular system with a container 200 defining six openings 202a through 202f and having three cable runways 214a through 214c. The openings 202a through 202f and cable runways 214a through 214c are specially arranged such that cables routed into the interior of the container 200 through any opening can be received readily by the cable runway 214a, 214b, or 214c. A bolt is inserted in each opening. Three of the bolts 204a, 204b, and 204c each define a plurality of seven conduits. Three bolts 204d, 204e, and 204f define only a single conduit. A bolt may define any number of conduits. The system as shown in FIG. 2 may include additional runways. For example, the system may include numerous additional cable runways that extend in the x direction, y direction, or z direction, or a combination thereof.

Figure 3A:
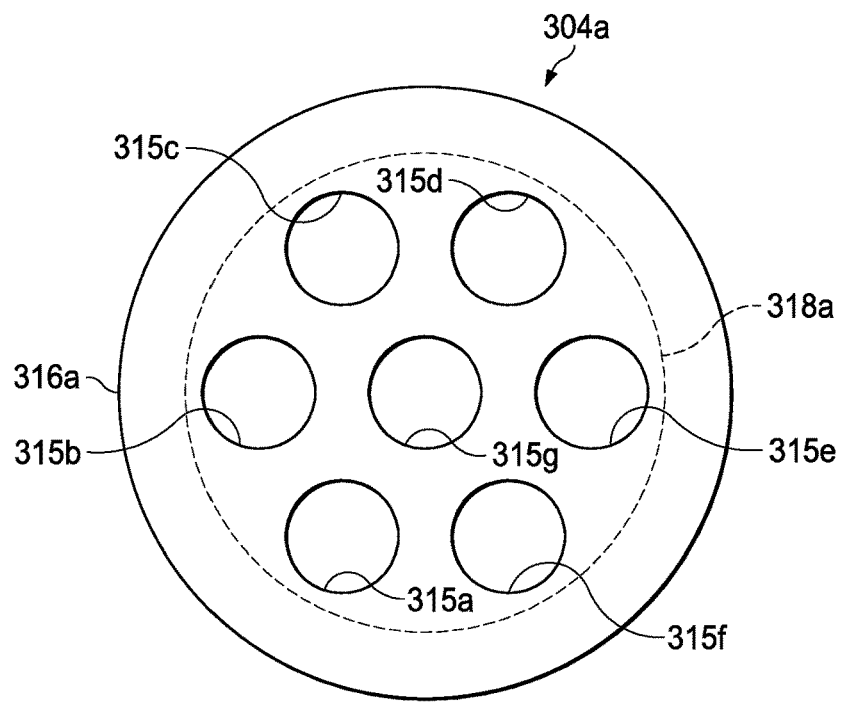
FIG. 3A is a perspective top view of a bolt with a plurality of conduits.

As mentioned above, the system may include a plurality of sized bolts. Such bolts, combined with pipes, allow the system to expand by creating closed paths from container to container. Different bolts may be desired for different applications. For example, a bolt may need a larger conduit to route a large number of cables. FIG. 3A depicts a top view of an example of a bolt 304a with a plurality of conduits 315a through 315g. The plurality of conduits 315a through 315g keep the system more organized. With smaller conduits, there are less cables per conduit, making the cables easier to track. The bolt 304a includes an outer ring 316a and a flange 318a. The flange 318a extends outwardly from the surface of the outer ring 316a. The outer ring 316a may contact a wall or washer, while the flange 318a is inserted into an opening. The conduits 315a through 315g are operable to receive cables and are thereby operable to route cables from container to container, from container to chamber, from chamber to container, from opening to opening, from opening to container, from container to opening, from opening to chamber, and from chamber to opening, or from any element to any element, from any element to a cable vault, or from a cable vault to any element.

Figure 3B:
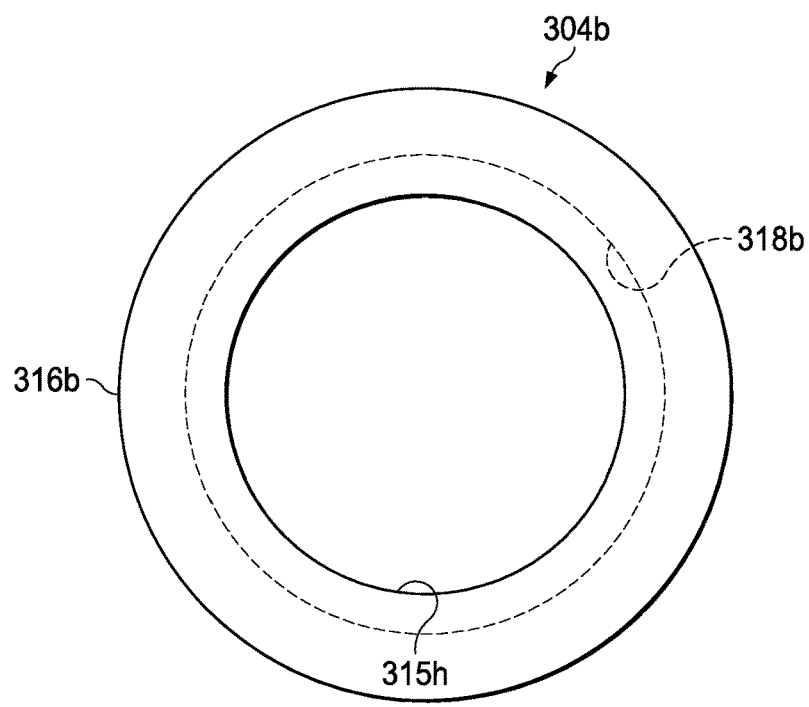
FIG. 3B is a perspective top view of a bolt with a single conduit.

A bolt defining only a single conduit may be desired for applications where there are a large number of cables to be routed and therefore a large area is needed to route the cables. A bolt defining a single conduit may also be also useful for routing larger objects through an opening. For example, a conduit may route a cable runway, thereby allowing a system to route a cable runway from one container to the next. FIG. 3B depicts a top view of an example of a bolt 304b with one conduit 315h. The bolt 304b includes an outer ring 316b and a flange 318b. The outer ring 316b may exert pressure against a wall, while the flange 318b is inserted into an opening. The conduit 315h is operable to receive cables and is thereby operable to route cables or cable runways from container to container, from container to a chamber of a pipe, from a chamber of a pipe to a container, from opening to opening, from an opening to a container, from a container to an opening, from an opening to a chamber, and from a chamber to an opening, from any element to any element, from a cable vault to any element, or from any element to a cable vault.

Figure 3C:
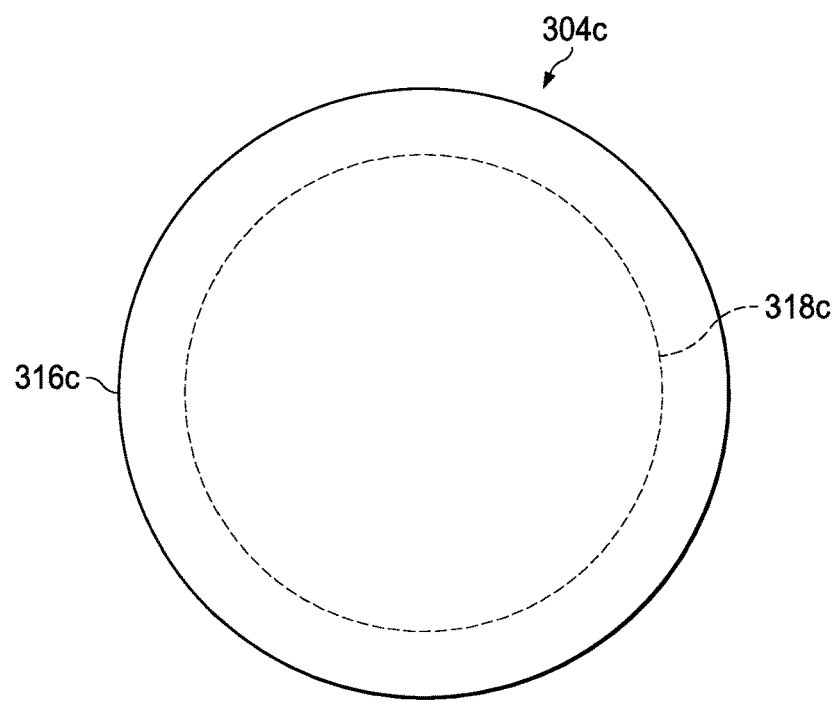
FIG. 3C is a perspective top view of a bolt for use in sealing an opening.

In some applications, an existing opening may need to be sealed. For example, a container may be pre-fabricated with an initial number of openings. A user may need to seal the openings to protect the interior, and cables and equipment therein, from outside elements such as rain, wind, or heat. The user may also wish to seal openings that the user made but no longer needs. FIG. 3C depicts a top view of an example of a bolt 304c used to seal an opening. The bolt 304c includes an outer ring 316c and a flange 318c. The outer ring 316c may exert pressure against a wall or a washer, while the flange 318c is inserted into an opening. The bolt 304c may be inserted into an opening to partially or fully seal the opening.

Figure 3D:
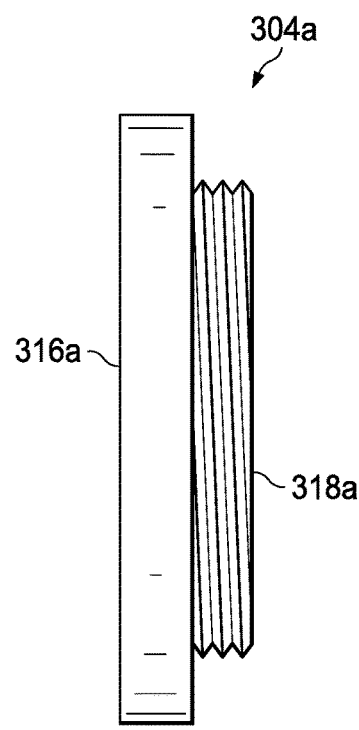
FIG. 3D is a perspective side view of a bolt.

One advantage of the system is that it may include a plurality of sized bolts, pipes, washers, or a combination thereof to allow for a user to easily modify the system as needed to suit the changing or particular needs of the user. To create a closed path using a pipe, the flange of a bolt may be configured to be received by a pipe. FIG. 3D depicts a side view of the bolt 304a shown in FIG. 3A, depicting one way a flange 318a is configured to be received by a pipe. The side of outer ring 316a is also viewable. The side view of bolt 304a could appear the same as the side view of the bolts in FIGS. 3B and 3C, as the sides of bolts 304b and 304c may also be configured as shown in FIG. 3D. A pipe may receive the flange 318a by the flange 318a being inserted into the chamber of the pipe. A pipe may receive the flange 318a by the pipe fitting within the flange 318a. A pipe may receive the flange 318a by the flange 318a fitting within the pipe. As shown in FIG. 3D, an outer surface of the flange 318a may be threaded. A pipe may be complementarily threaded in the chamber to receive the flange 318a by the flange 318a being threadedly inserted into the chamber. The flange 318a is shown threaded on its outer surface. A flange may be threaded on its inner surface, its outer surface, both, or neither. A pipe may be complementarily threaded on the outer surface of the pipe such that the pipe receives the flange 318a by the pipe being threadedly inserted into the flange 318a. A pipe may be threaded on its inner surface, its outer surface, both, or neither.

Figure 4A:
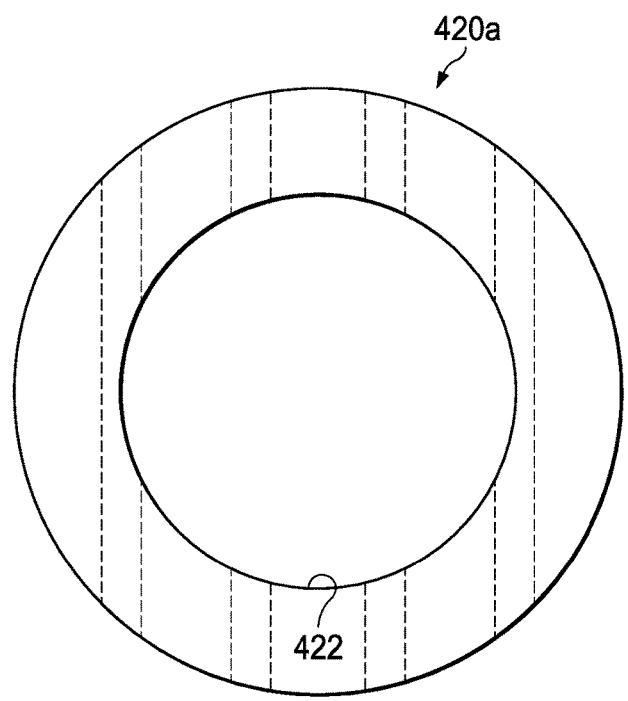
FIG. 4A is a perspective top view of a washer.

When a bolt is tightened, for example by being threadedly inserted into a pipe, the bolt will exert pressure against a container wall. If tightened enough, the pressure exerted by the bolt will damage the container wall. To prevent damage to the container wall, the system may include a washer or a plurality of washers that fit between an outer ring of a bolt and a wall. The plurality washers may be variably sized and used with corresponding variably sized bolts to increase the modularity and interchangeability of the system. FIG. 4A depicts a top view of a washer 420a. One or a plurality of washers may be used as part of the modular system. The washer 420a defines a hole 422. The washer 420a may fit around an opening, thereby contacting an interior surface or exterior surface of a wall of a container, and exerting pressure against a wall when a bolt or pipe is tightened against the washer 420a. The washer 420a may contact the outer ring of a bolt and may receive a flange of a bolt through the hole 422. The outer ring of the bolt may be tightened against the washer 420a, the washer 420a distributing pressure across a surface contacting the wall of the container.

Figure 4B:
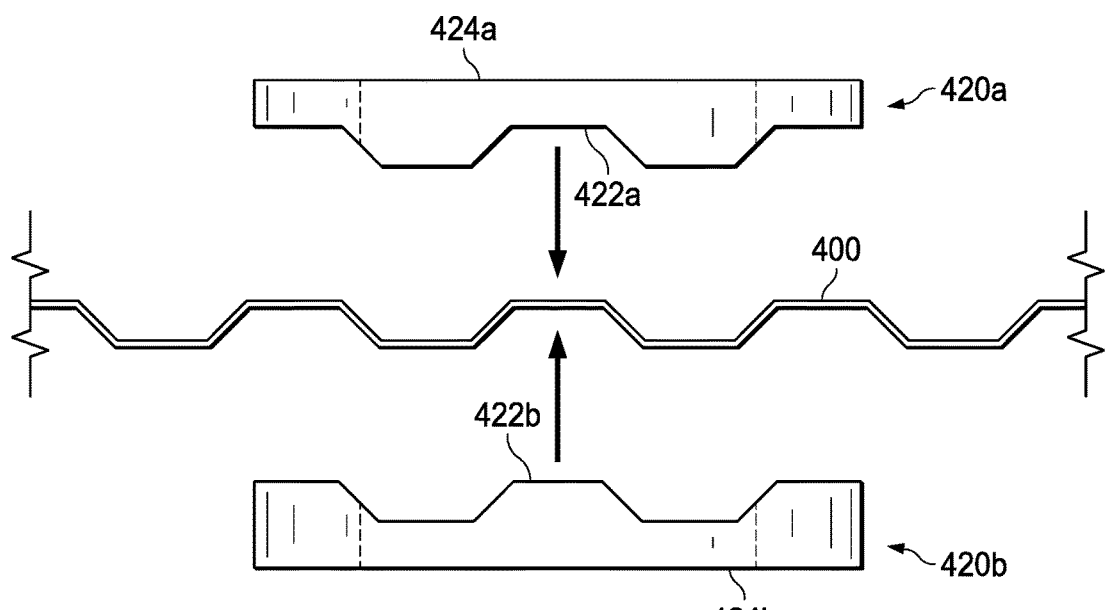
FIG. 4B is a perspective side view of two washers and a wall of a container.

To show how the washers may fit against a container wall to distribute pressure, FIG. 4B depicts an exemplary side view of two washers 420a and 420b and a wall of a container 400. The container wall is corrugated. Each washer 420a and 420b has a corrugated side 422a and 422b, respectively, to complement a corrugated container wall (as discussed later by example in FIG. 5B). The corrugated sides 422a and 422b complement each other so the washers 420a and 420b can be used at the same location on the container wall with one washer in the interior of the container and one washer on the exterior of the container. The pair of washers 420a and 420b may be referred to as a set of complementing washers. The system may include a plurality of complementing washers. Each washer 420a and 420b has a second washer side 424a and 424b, respectively. The second washer sides 424a and 424b, as shown by example in FIG. 4B, are flat. A flange of a bolt may be inserted into a hole of each washer 420a and 420b and into an opening of the container 400. If the bolt is tightened such that an outer ring of the bolt exerts pressure against a wall of the container 400, the washer 420a or 420b may distribute the pressure across the washer 420a or 420b and the wall. The tightened bolt may be received by a cap or pipe on the other side of the wall of the container 400. The cap or pipe by being tightened against the bolt may exert pressure on the container wall on the other side of the container wall. The washer 420a or 420b by contacting the cap or pipe may distribute the pressure across the washer 420a or 420b and the wall.

Figure 5A:
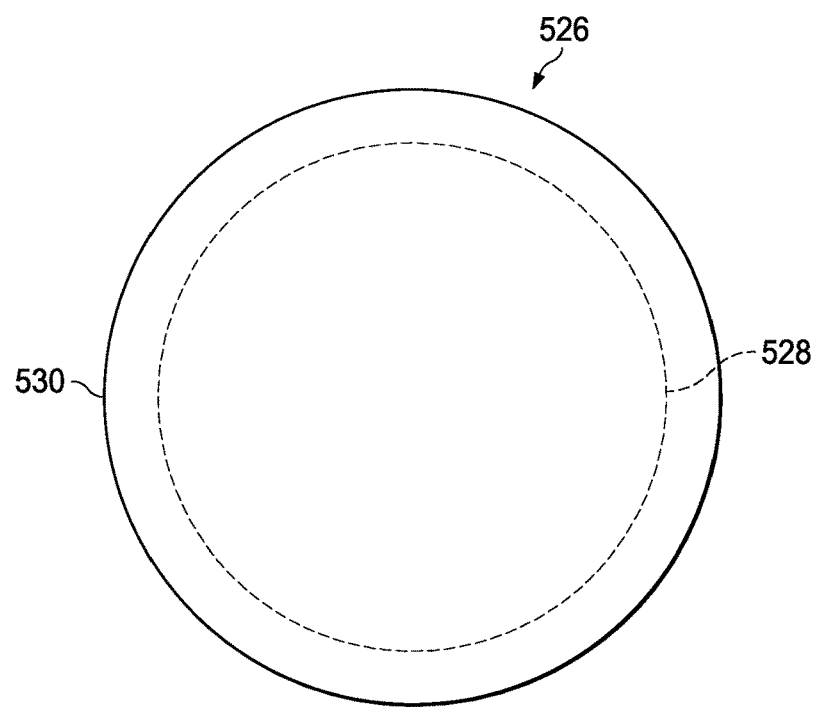
FIG. 5A is a perspective top view of a cap.

As described above, a user may wish to seal an opening defined by a container to protect the interior of the container. Sealing an opening protects the interior of the container and the equipment therein from heat, moisture, wind, and rain, for example. A user may create an opening and thereafter no longer need the opening. The container may arrive to the user pre-fabricated with an opening that the user does not currently need. FIG. 5A depicts a top view of an exemplary cap 526 that is operable to temporarily or permanently seal an opening. One or a plurality of caps may be used as part of the modular system. The cap 526 has a cap flange 528 that enables the cap 526 to receive a bolt. The cap 526 has a cap outer ring 530 to contact a washer or a wall of a container and seal an opening.

Figure 5B:
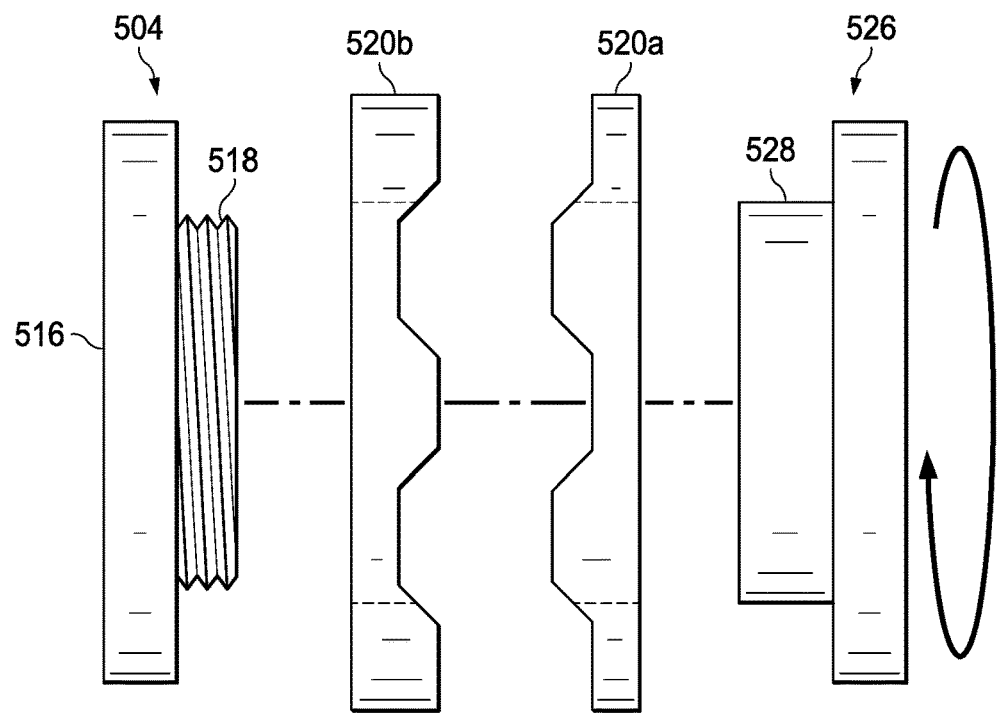
FIG. 5B is a perspective side view of a bolt, two washers, and a cap.

FIG. 5B depicts an exploded view of an exemplary seal with two washers 520a and 520b, a bolt 504, and the cap 526. The cap flange 528 may extend through a hole of the washer 520a. The cap 526 may receive a flange 518 of the bolt 504 that extends through a hole of the washer 520b. The cap 526 may be received by the flange 518 being threadedly inserted into the cap flange 528. As shown in FIG. 5B, an outer surface of the flange 518 is threaded. The cap flange 528 is complementarily threaded on its inner surface such that the flange 518 may be threadedly inserted into the cap flange 528.

A flange may receive a cap in any number of ways. For example, a cap flange may be complementarily threaded on its outer surface to receive threads on the inner surface of flange of a bolt. A cap may receive a flange by a cap flange tightly fitting within a flange. A cap may receive a flange by the flange tightly fitting within a cap flange. A cap flange may be complementarily threaded on the outside of the cap flange such that the cap flange receives a flange of the bolt by the cap flange being threadedly inserted into the flange.

Figure 5C:
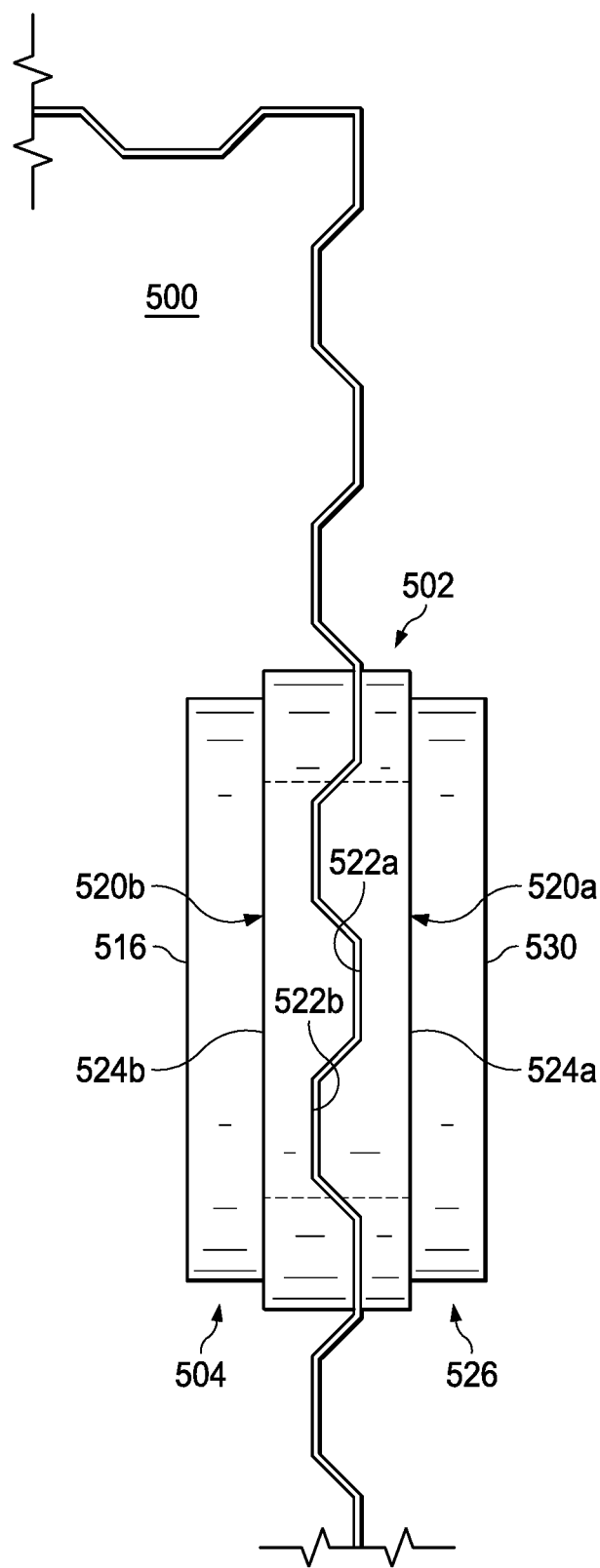
FIG. 5C is a perspective side view of a sealed container opening.

FIG. 5C depicts an example of a sealed container opening, using the components of FIG. 5B. The cap 526 is receiving the flange of the bolt 504 thereby sealing an opening 502 defined by a container 500. Corrugated sides 522a and 522b of the washers 520a and 520b complement each other and a corrugated wall of the container 500 on the exterior and interior of the container 500. The second side 524b of the washer 520b contacts the outer ring 516 of the bolt 504. The second side 524a of the washer 520a contacts the cap outer ring 530. The washers 520a and 520b distribute the pressure exerted towards the wall of the container 500 caused by the cap flange receiving the flange of the bolt 504. A user of the modular system may wish to use a cap 526 to seal an opening to protect the interior of the container 500 and its contents. Although not shown by FIG. 5C, a cap may be used on the interior of a container, with a bolt on the exterior.

Figure 6A:
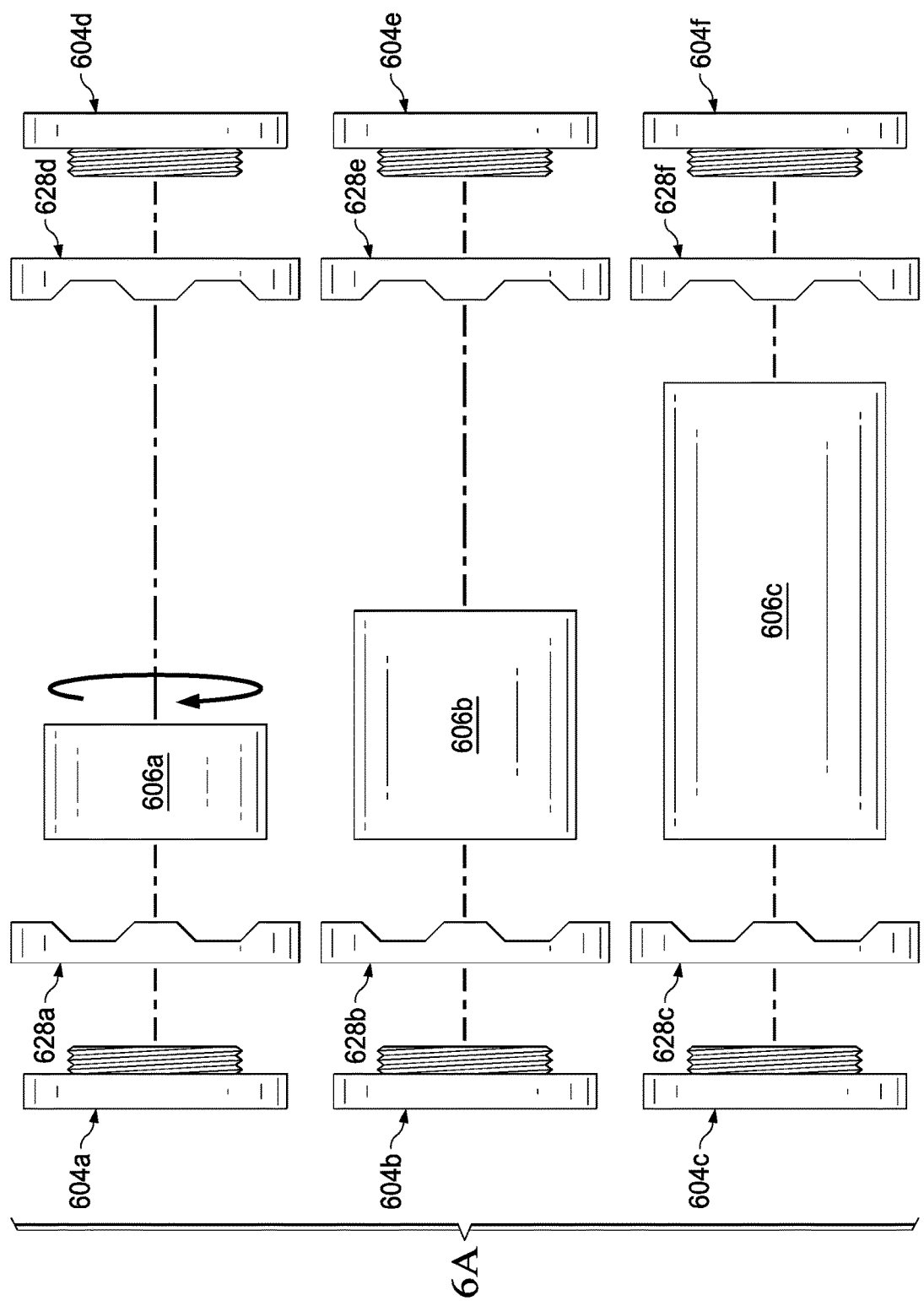
FIG. 6A is a perspective side view of a plurality of pipes, a plurality of bolts, and a plurality of washers.

A plurality of parts allows the system to be modularly expanded with ease and at low cost—as the expansion does not always require specialized planning and configuration. For example, the system may be expanded in any direction by adding a container and a closed path from the new container to an existing container through use of a pipe, two bolts, two openings, and two washers. FIG. 6A depicts an example of a plurality of pipes 606a, 606b, and 606c, washers 628a, 628b, 628c, 628d, 628e, and 628f, and bolts 604a, 604b, 604c, 604d, 604e, and 604f. Each pipe 606a, 606b, and 606c is shown having a different length. Different lengths for pipes 606a, 606b, and 606c may be desired for different distances between containers of the modular cabling system. For example, the distance between one container to another container may not be as great when the one container is stacked on the other container. Thus, some containers may need shorter pipes for certain paths between containers and longer pipes to create paths to other containers. A user may want to use a longer pipe and path, for example, to create a large enough distance between containers such that a person can walk between containers to easily access each container.

Figure 6B:
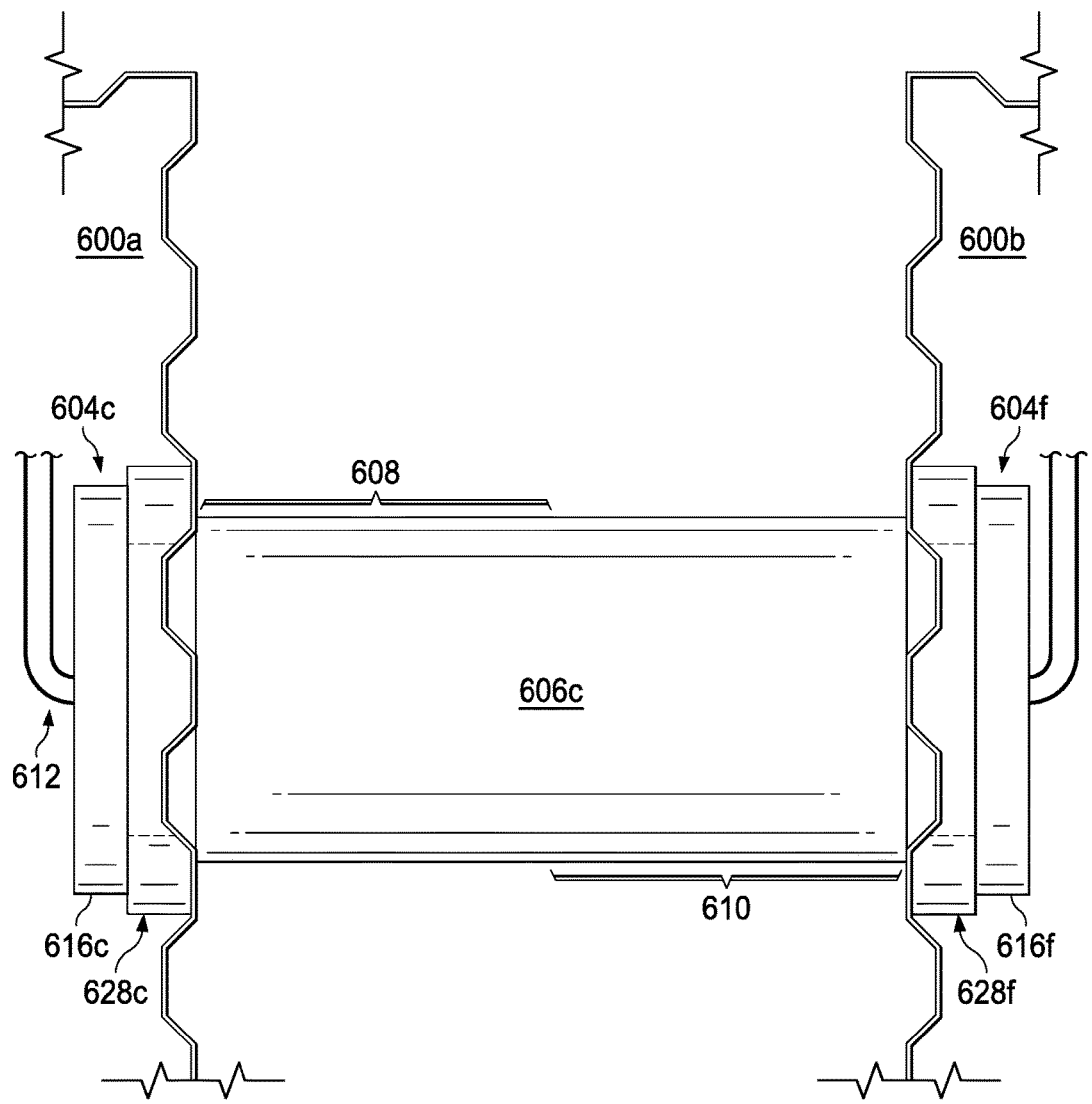
FIG. 6B is a perspective side view of a closed path between containers.

With components shown in FIG. 6A, FIG. 6B depicts an example of a closed path of a modular system routing a plurality of cables 612 from a first container 600a to a second container 600b. The pipe 606c receives at a first side 608 a flange of a first bolt 604c of a plurality of bolts 604c and 604f. The pipe 606c receives at a second side 610 a flange of a second bolt 604f of the plurality of bolts 604c and 604f. Holes defined by each washer 628c and 628f receive a respective flange of the bolts 604c and 604f. Each outer ring 616c and 616f is shown contacting and exerting pressure against the washer 628c and the washer 628f, respectively. The washer 628c and the washer 628f are shown contacting and exerting pressure against an interior surface of the container 600a and the container 600b, respectively. The pipe 606c, and flanges are thereby operable to receive the plurality of cables 612 and route the plurality of cables 612 from an interior of the first container 600a, through a conduit defined by a flange of the first bolt 604c of the plurality of bolts 604c and 604f, through an opening defined by a wall of the first container 600a, into the chamber of the pipe 606c, through a conduit defined by a flange of the second bolt 604f of the plurality of bolts 604c and 604f, and out of an opening defined by a wall of the second container 600b and into an interior of the second container 600b. The pipe 606c, and flanges are also operable to route a plurality of cables 612 from the interior of the second container 600b into the interior of the first container 600c.

Figure 7:
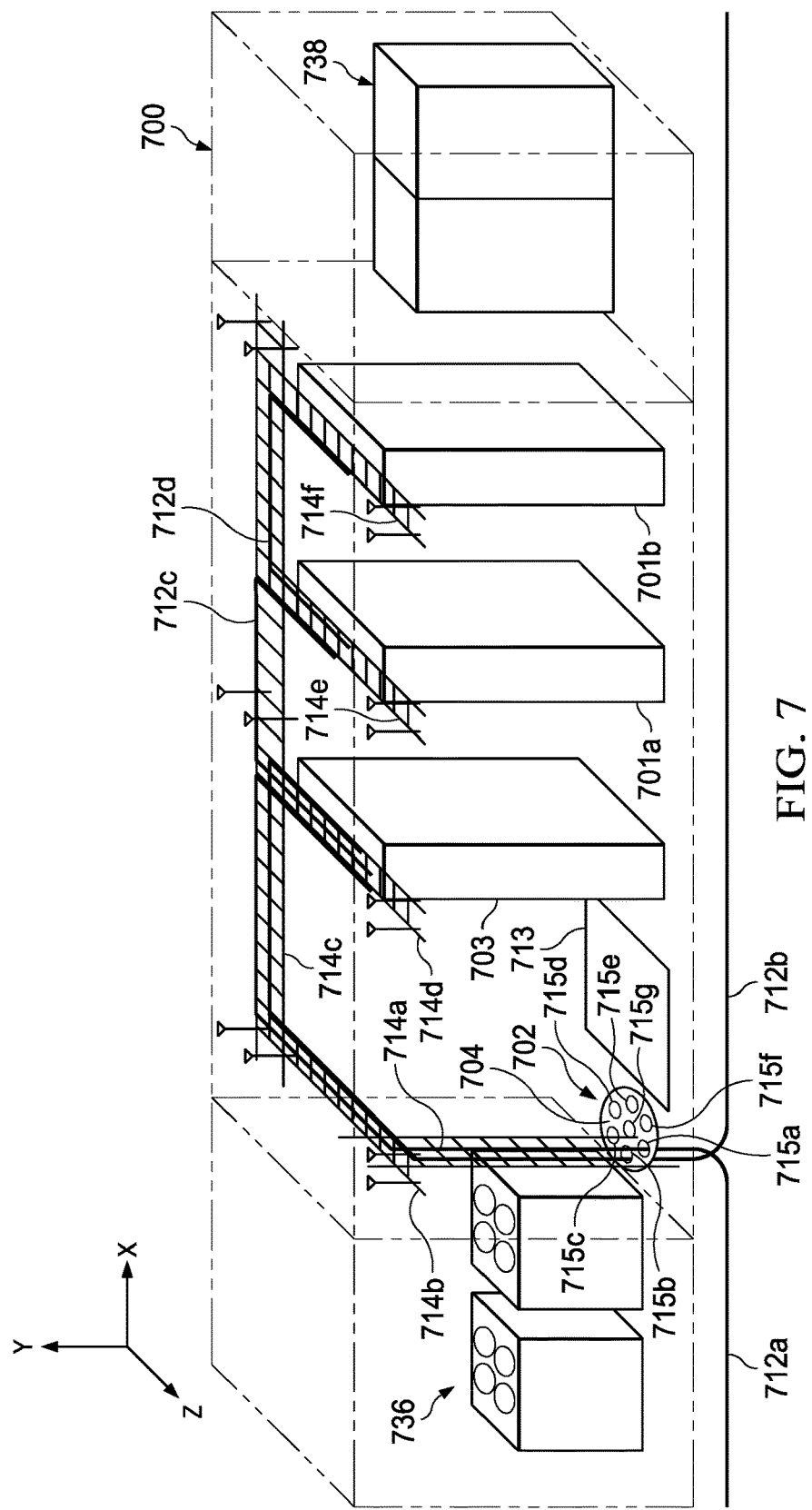
FIG. 7 is a schematic diagram of a telecommunications central office.

In one example of the system, as shown in FIG. 7, the system may include a telecommunications central office. The system can be used as a telecommunications central office because the system is configured to operate with a large number of cables, as is often present at a telecommunications central office. The telecommunications central office may be a fully-operational, all-in-one telecommunications central office. The telecommunications central office includes a container 700. The container 700 is shown with a plurality of equipment 701a and 701b. Equipment 701a and equipment 701b may include any kind of switching components, multiplexors, tributary cards, servers, power modules, communication equipment, or other electronic equipment, including any telecommunications central office equipment. The container 700 is also shown with an opening 702 and a distribution frame 703 for routing signals. Examples of distribution frames include main distribution frames, intermediate distribution frames, optical distribution frames, and digital distribution frames.

Also shown in FIG. 7 is a bolt 704 inserted into the opening 702 defined by an x-z wall of the container 700. The bolt 704 defines a plurality of conduits 715a through 715g. A conduit 715a and a conduit 715b defined by the bolt 704 are shown receiving a cable 712a and a cable 712b, respectively, from a cable vault.

FIG. 7 depicts a plurality of cable runways 714a through 714f operable to receive and route a plurality of cables 712a through 712d. Shown in FIG. 7 are exemplary routes that cables 712a through 712d may be routed using the cable runways 714a through 714f. For example, a cable runway 714a extending in the y direction (a y cable runway) is shown receiving from the opening 702 and from the conduits 715a and 715b a plurality of cables 712a and 712b. A cable runway 714b extending in the z direction (a z cable runway) receives, from the y cable runway 714a, the cables 712a and 712b. A cable runway 714c extending in the x direction (an x cable runway) receives from a z cable runway 714b the cable 712a and the cable 712b. A z cable runway 714d receives from the x cable runway 714d the cable 712a and the cable 712b. The distribution frame 703 receives the cable 712a and the cable 712b. The runways may be rearranged such that any one cable runway extending in any direction may receive cables from any cable runway extending in any direction. The distribution frame 703 may receive cables directly from the opening 702 and any of the conduits 715a through 715g. The distribution frame 703 may receive cables from any cable runway extending in any direction. The cable runways 714a through 714f are operable to receive any cables from any opening, from other cable runways, from equipment 701a and 701b, from distribution frame 703, to any element from any element, or any combination thereof. By using the cable runways 714a through 714f to receive cables 112, the telecommunications central office can route cables 712a through 712d to and from openings, to and from other cable runways, to and from equipment 701a and 701b, to and from distribution frame 703, to any element from any element, or any combination thereof.

To allow communication between the distribution frame 703 and equipment 701a, cable runways 714c, 714d, and 714e route cable 712c from distribution frame 703 to equipment 701a. To allow communication between the equipment 701a and equipment 701b, cable runways 714d, 714e, and 714f route cable 712f from equipment 701b to equipment 701c. Any number of cables can be routed to any component from any component.

Personnel such as technicians may need to access the utility vault to check connections or perform maintenance. To allow for such access, the container 700 includes an x-z wall that defines a cable vault entrance 713. The cable vault entrance 713 may allow personnel to access a cable vault, or utility vault, from the container 700.

Telecommunications central offices may generate heat through electric current through its cables and operations of its equipment and distribution frames. Heat can cause electronics to fail and may cause the interior of the container to reach unsafe or uncomfortable temperatures. The telecommunications central office shown in FIG. 7 also has a cooling system 736 to keep the equipment cooled to prevent electronic failure or unsafe or uncomfortable temperatures. Examples of the cooling system include fans, A/C units, or both.

To power electronics, the telecommunications central office shown in FIG. 7 includes a power system 738. The power system may have batteries, generators, transformers, power regulators, or a combination thereof.

Figure 8:
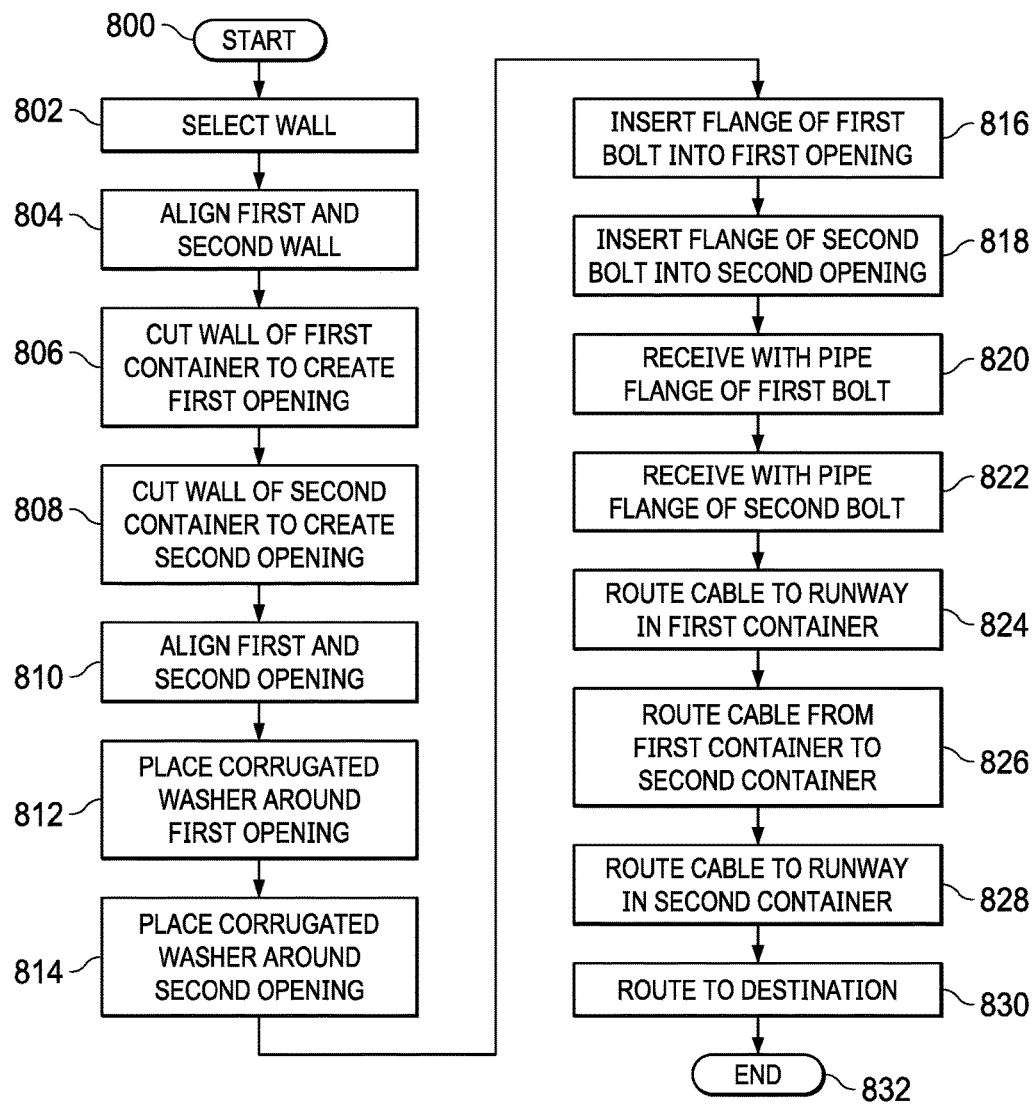
FIG. 8 is a flow chart of a method for arranging a plurality of cables.

FIG. 8 depicts an exemplary method for arranging a plurality of cables. The method includes using any of the systems or components described above with respect to FIGS. 1 through 7. The method includes starting the arranging at step 800. The method includes selecting walls of containers to be cut at step 802. The method includes aligning a wall of a first container with a wall of a second container at step 804. Step 804 may include stacking the second container on the first container. The method includes cutting a first wall of the first container to create an opening at step 806. The cutting of the wall of the first container includes cutting any wall of the first container. The method includes cutting a second wall of a second container to create a second opening at step 808. The cutting the second wall of the second container includes cutting any wall of the second container.

The method includes aligning the first and second opening at step 810. The method includes placing a corrugated washer around the first opening at step 812. The method includes placing a corrugated washer around a second opening at step 814. The method includes inserting a flange of a first bolt into the first opening at step 816. The method includes inserting a flange of a second bolt into the second opening at step 818. The method includes receiving with a pipe, the flange of the first bolt at a first side of the pipe at step 820. In other examples, step 820 can occur before step 818. The method includes receiving with a pipe, the flange of the second bolt at a second side of the pipe at step 822.

The method includes routing a cable to a runway in the first container at step 824. The cable may be one of a plurality of cables. The method includes routing a cable from the interior of the first container to a second container at step 826. Step 826 may include routing a cable through the first opening, a conduit of the first bolt, a chamber of the pipe, the second opening, and a conduit of the second bolt into the interior of the second container. The method includes routing a cable to a runway in the second container at step 828. The method includes routing the cable to a destination at step 830. The destination may include, for example, telecommunications central office equipment, server equipment, or any other electrical equipment. The method may end at step 832.

The method allows for lower cost at startup than other solutions because it enables a pay-as-you-grow structure—a provider does not need to buy additional space until it is needed. Additionally, the method allows for more organized cable systems, allowing the provider to decrease error, prevent damage cables or a system, and more easily trace cables and locate errors.

The above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents and shall not be restricted or limited by the foregoing detailed description.

The invention claimed is:

1. A modular cabling system, comprising:
    a plurality of containers, the plurality of containers including a first container and a second container stacked on the first container; and
    a first bolt, wherein:
        a ceiling of the first container defines a first opening;
        a floor of the second container defines a second opening;
        the first bolt comprises a first outer ring and a first flange, the first flange inserted into the first opening; and
        the first bolt defines a first conduit operable to receive at least a first cable of a plurality of cables, wherein
    a second flange of a second bolt is inserted into the second opening defined by the first container; and
    a cap at an exterior of the first container receives the second flange, thereby sealing the second opening.

2. The modular cabling system of claim 1, further comprising:
    a third container defining a third opening;
    a second bolt defining a second conduit, the second bolt comprising a second outer ring and a second flange;
    a third bolt defining a third conduit, the third bolt comprising a third outer ring and a third flange; and
    a plurality of pipes, the plurality of pipes comprising a first pipe, wherein:
    the first pipe comprises a first side and a second side;
    the first pipe defines a chamber;
    the second flange is inserted into a fourth opening defined by the first container;
    the third flange is inserted into the third opening;
    the first pipe receives with the chamber the second flange at the first side through the fourth opening;
    the first pipe receives with the chamber the third flange at the second side through the third opening; and
    the first pipe, the second bolt, and the third bolt route at least the first cable of the plurality of cables from the first container through the fourth opening, through the second conduit, through the chamber, through the third conduit, through the third opening, and into the third container.

3. The modular cabling system of claim 2, wherein:
    the second flange comprises threads on an outer surface of the second flange; and
    the chamber is complementarily threaded in to receive the threads.

4. The modular cabling system of claim 2, wherein:
    the second flange comprises threads on an inner surface of the second flange; and
    an outer surface of the first pipe is complementarily threaded to receive the threads.

5. The modular cabling system of claim 2, wherein a cable runway extends from the first container through the fourth opening, through the second conduit, through the chamber, through the third conduit, through the third opening, and into the third container.

6. The modular cabling system of claim 1, wherein a cable runway extends from the first container, through the first opening, through the first conduit, and through the second opening into the second container.

7. The modular cabling system of claim 1, wherein:
    the ceiling of the first container comprises a corrugated wall;
    the modular cabling system comprises a washer with a corrugated side and a second washer side;
    the washer defines a hole and receives through the hole the first flange;

the washer contacts, at the second washer side, the first outer ring; and the corrugated side complements the corrugated wall, the washer thereby operable to distribute pressure exerted by the first bolt across the washer.

8. The modular cabling system of claim 1, wherein:

a first washer defines a first hole and receives through the first hole the second flange;

the first washer contacts an interior of the first container thereby operable to distribute pressure exerted by the second bolt across the first washer;

a second washer defines a second hole and receives through the second hole a cap flange of the cap; and the second washer contacts a cap outer ring of the cap and an exterior of the first container thereby operable to distribute pressure exerted by the cap across the second washer.

9. The modular cabling system of claim 1, wherein the first container comprises a first wall defining a third opening, a second wall defining a fourth opening, a third wall defining a fifth opening, a fourth wall defining a sixth opening, and a fifth wall defining a seventh opening.

10. The modular cabling system of claim 1, further comprising:

a system of interconnected cable runways, comprising:

a plurality of x cable runways extending in an x direction; and a plurality of z cable runways extending in an z direction, wherein:

the plurality of x cable runways extending in the x direction comprises a first cable runway;

the first cable runway is in an interior of the first container;

the plurality of z cable runways extending in the z direction comprises a second cable runway; and the second cable runway is in an interior of the second container.

11. The modular cabling system of claim 1, further comprising:

a second bolt comprising a second outer ring and a second flange, the second bolt defining a second conduit, the second flange inserted into the second opening; and a pipe comprising a first side and a second side, the pipe defining a chamber wherein:

the pipe receives with the chamber the first flange at the first side;

the pipe receives with the chamber the second flange at the second side through the second opening; and the pipe, the first bolt, and second bolt route at least the first cable of the plurality of cables from the first container through the first opening, through the first conduit, through the chamber, through the second conduit, through the second opening, and into the second container.

12. The modular cabling system of claim 1, further comprising a distribution frame and an equipment in the first container.

13. The modular cabling system of claim 1, wherein the first bolt further defines a second conduit operable to receive at least a second cable of the plurality of cables.

14. A modular cabling system comprising:

a plurality of containers, the plurality of containers including a first container and a second container stacked on the first container; and a first bolt, wherein:

a ceiling of the first container defines a first opening;

a floor of the second container defines a second opening;

the first bolt comprises a first outer ring and a first flange, the first flange inserted into the first opening; and the first bolt defines a first conduit operable to receive at least a first cable of a plurality of cables, wherein a second flange of a second bolt is inserted into the second opening defined by the first container; and a cap in an interior of the first container receives the second flange, thereby sealing the second opening.

15. A modular cabling system comprising:

a plurality of containers, the plurality of containers including a first container and a second container stacked on the first container;

a y cable runway extending through an interior of the first container in a y direction;

an x cable runway extending through the interior of the first container in an x direction; and a z cable runway extending through the interior of the first container in a z direction; and a first bolt, wherein:

a ceiling of the first container defines a first opening;

a floor of the second container defines a second opening;

the first bolt comprises a first outer ring and a first flange, the first flange inserted into the first opening; and the first bolt defines a first conduit operable to receive at least a first cable of a plurality of cables.

* * * * *